(12) United States Patent
Chen et al.

(10) Patent No.: US 8,164,187 B2
(45) Date of Patent: Apr. 24, 2012

(54) FLIP CHIP DEVICE AND MANUFACTURING METHOD THEREOF

(75) Inventors: Wen-Chih Chen, Hsin Chu Hsien (TW); Sheng-Shu Yang, Hsin Chu (TW)

(73) Assignees: Taiwan TFT LCD Association, Hsinchu (TW); Chunghwa Picture Tubes, Ltd., Taoyuan (TW); Au Optronics Corp., Hsinchu (TW); Hannstar Display Corp., Taipei (TW); Chi Mei Optoelectronics Corp., Tainan County (TW); Industrial Technology Research Institute, Hsinchu (TW); Toppoly Optoelectronics Corp., Miao-Li County (TW); Quanta Display Inc., Tao Yuan Shien (TW)

( * ) Notice: Subject to any disclaimer, the term of this patent is extended or adjusted under 35 U.S.C. 154(b) by 377 days.

(21) Appl. No.: 12/429,237

(22) Filed: Apr. 24, 2009

(65) Prior Publication Data

US 2009/0206478 A1    Aug. 20, 2009

Related U.S. Application Data

(63) Continuation-in-part of application No. 11/094,198, filed on Mar. 31, 2005, now abandoned.

(30) Foreign Application Priority Data

Dec. 14, 2004  (TW) ................ 93138755 A

(51) Int. Cl.
*H01L 23/048* (2006.01)
(52) U.S. Cl. ........................................ 257/737; 257/778
(58) Field of Classification Search .................. 257/737, 257/778, E21.519
See application file for complete search history.

(56) References Cited

U.S. PATENT DOCUMENTS

| | | | |
|---|---|---|---|
| 5,090,118 A | | 2/1992 | Kwon et al. |
| 5,397,245 A | | 3/1995 | Roebuck et al. |
| 5,508,228 A | | 4/1996 | Nolan et al. |
| 5,877,556 A | | 3/1999 | Jeng et al. |
| 6,972,490 B2 * | | 12/2005 | Chang et al. ............... 257/737 |
| 2005/0140028 A1 * | | 6/2005 | Venkateswaran ............. 257/782 |

FOREIGN PATENT DOCUMENTS

TW         200402859         2/2004

* cited by examiner

*Primary Examiner* — Howard Weiss
*Assistant Examiner* — Steven Rao

(57) ABSTRACT

A flip chip device made using LCD-COG (liquid crystal display-chip on glass) technique. The flip chip device comprises a substrate, at least one chip having active area with a plurality of compliant bumps thereon. The compliant bumps are centrally disposed in the center of the chip for electrically connecting the chip and the substrate. An adhesive is daubed on a joint area of the substrate and the chips for jointing the substrate and the chips. By limiting the position of the compliant bumps so that they are centrally disposed on the chips, the thermal warpage of the substrate is reduced.

18 Claims, 21 Drawing Sheets

FLIP CHIP DEVICE AND MANUFACTURING METHOD THEREOF

CROSS-REFERENCE TO RELATED APPLICATIONS

This application is a Continuation-in-Part of application Ser. No. 11/094,198, filed on 31 Mar. 2005, and entitled FLIP CHIP DEVICE.

BACKGROUND OF THE INVENTION

1. Field of the Invention

The present invention relates to a flip chip device and a manufacturing method thereof, and more particularly to a flip chip device using a LCD-COG (liquid crystal display-chip on glass) technique.

2. Description of the Prior Art

In flip chip technology the jointed surface of the chip and the substrate form a pad or bump replacing the lead frame used in wire bonding technology. By directly stressing the bump or pad of the jointed surface of the chip and the substrate, electric conduction of the circuit is achieved. Recently, due to advances in the related technology, electronic products are becoming increasingly smaller and lightweight, so the applications of flip chip technology are increasing day by day.

The flip chip device of the prior art is the surface of the chip and the bumps formed by the substrate; the surface of the substrate is daubed with an adhesive and then the chip and the substrate are stressed to complete the flip chip device. Because the thermal expansion coefficient of the chip is different from that of the glass substrate, it may result in a certain degree of warp causing a disproportionate gap in the center and on the edge of the IC chip.

In order to improve upon the above stated disadvantages, U.S. Pat. No. 5,508,228 discloses "compliant electrically connective bumps for an adhesive flip chip integrated circuit device and methods for forming same". As shown in FIG. 1, a compliant bump includes an IC chip 10, a compliant bump 14 covering a metal layer 16 thereon is formed on a bond pad 12 and connected to glass base 18.

FIG. 2 shows ROC Patent No. 200402859 that discloses "Bump structure and method of making". A compliant bump includes an IC chip 20 with a plurality of conductive joints 22 and a protective film 26 covering the joints 22, and a compliant bump 28. The compliant bump 28 is formed with a lower metal layer 23, a polymer bump 21, an upper metal layer 24 and a metal layer 25.

However, due to the limits of the initial arrangement of the IC, regardless of whether gold bumps or compliant bumps are used, these bumps will always have a ringed-type arrangement. FIG. 3 shows a plurality of bumps 31 ringed around an IC chip 30. This arrangement may however, have a bad effect when applied to the COG junction. As shown in FIG. 4A, this is a schematic view of a COG of the flip chip device. The IC chip 34 and the substrate 35 are jointed via the bumps 37 and the conductive adhesive 36 (as the anisotropic conductive film). Each bump 37 is arranged under the I/O pad 341 of the IC chip 34, therefore, the bump 37 are disposed on the outer periphery of IC chip 34 as shown in FIG. 3. FIG. 4B shows a drawing of a warped COG of the flip chip device due to the thermal applied force of the prior art. Because the IC chip 34 and the substrate 35 are fixed together, and the thermal expansion coefficient of the IC chip 34 ($\alpha=3$ ppm) is different from that of the glass substrate 35 ($\alpha=4.6$ ppm), it causes a certain degree of warp $\delta$ according to the distance L from the center of the device (line A represents IC chip 34, and line B represents substrate 35). In other words, with the lager L, the degree of warp $\delta$ of the substrate 35 is larger because the outer periphery of the substrate 35 of IC chip 34 is attached on the outer periphery of IC chip 34.

The inventor of the present invention recognizes the above shortage should be corrected and special effort has been paid to research this field. The present invention is presented with reasonable design and good effect to resolve the above problems.

SUMMARY OF THE INVENTION

The prime objective of the present invention provides a flip chip device having a chip with the compliant bumps centrally disposed on the center of chips so that the warpage of substrate can be reduced in the thermal bonding process.

For achieving the objectives stated above, a flip chip device comprises a substrate, at least one chips having active area and a plurality of compliant bumps thereon. The compliant bumps are centrally disposed on the center of the chips for electrically connecting the chips and the substrate; and an adhesive daubed on a joint area of the substrate and the chips for jointing the substrate and the chips. After bonding the chip on the substrate, the outer periphery of the chip is suspending from the substrate in order to reduce the warp of the substrate.

The present invent further provides a manufacturing method for the flip chip device with reduced thermal warp of the substrate.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

FIG. 7D-1 is a cross-sectional view showing the flip chip device of the present invention;

FIG. 7D-2 is a cross-sectional view showing another structure the flip chip device of the present invention;

FIG. 7D-3 is a cross-sectional view showing the flip chip device with a second adhesive of the present invention;

FIG. 7E-1 is a cross-sectional view showing the passive component covered by the adhesive of the present invention;

FIG. 7E-2 is a cross-sectional view showing the passive component covered by a second adhesive of the present invention;

FIG. 7G-1 is a cross-sectional view showing the flip chip device with a second adhesive of the present invention;

DETAILED DESCRIPTION OF THE PREFERRED EMBODIMENTS

Figure 5:
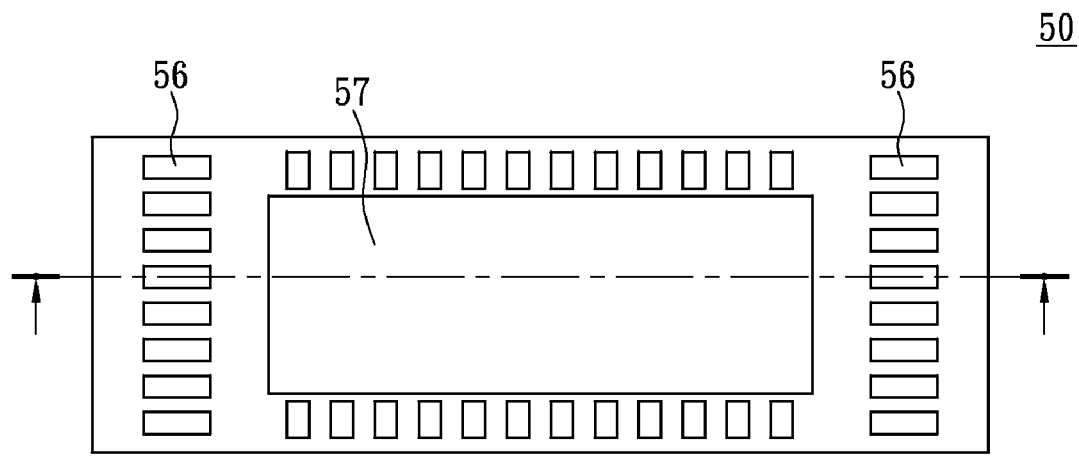
FIG. 5 to FIG. 5G show the steps for manufacturing a chip with compliant bumps of the present invention.
Figure 7A:
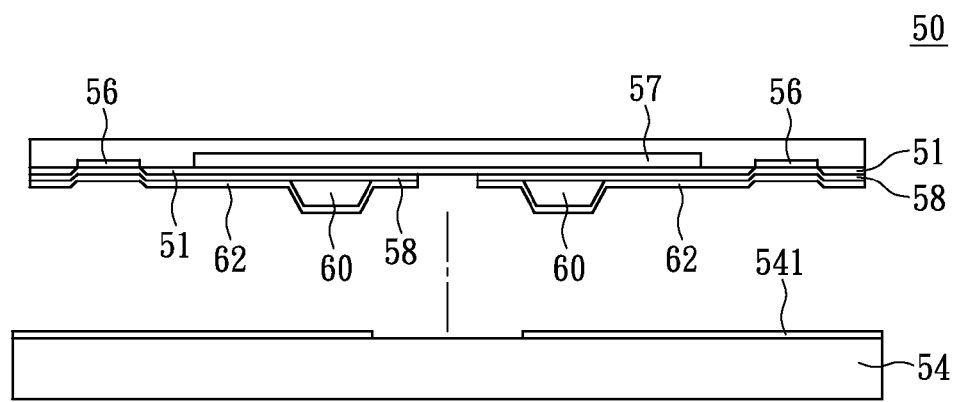
FIG. 7A to FIG. 7B show the steps of bonding the chip and the substrate of the present invention.
Figure 7B:
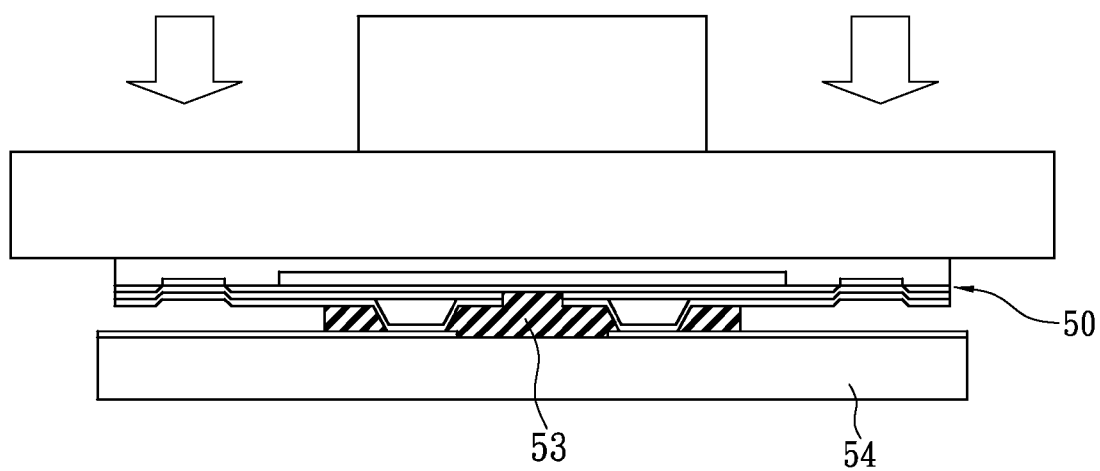
Figure 7C:
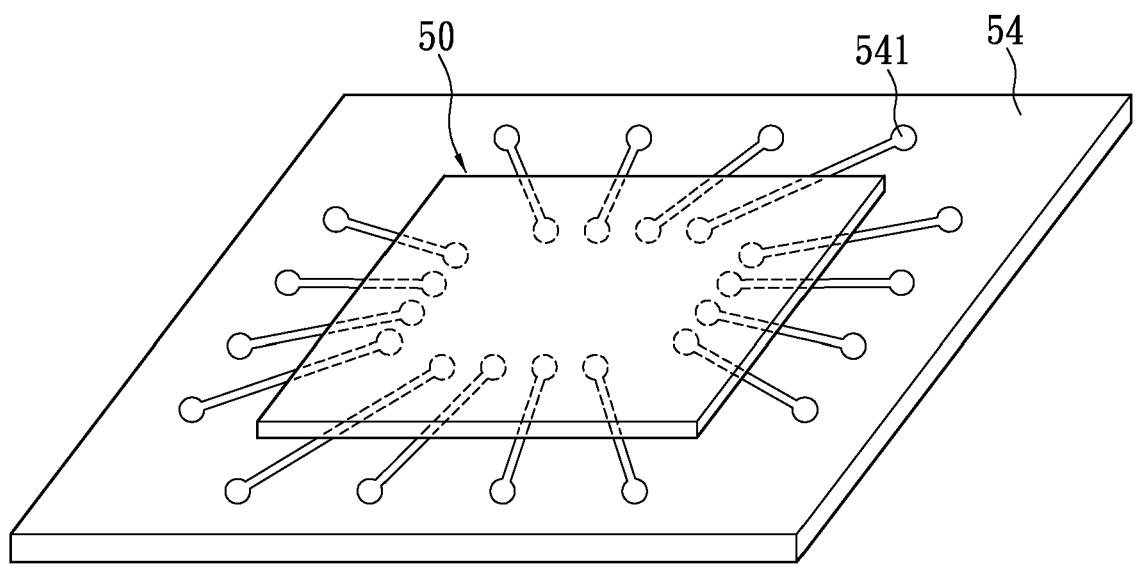
FIG. 7C is a schematic view showing the flip chip device of the present invention.

Reference is made to FIG. 7C, which is a schematic view showing the structure of the flip chip device of the present invention. The flip chip device includes a substrate 54 and a chip 50. The chip 50 has an active area 57 in the middle portion thereof and a plurality of connecting pads 56 (i.e., I/O pad) is disposed surrounding the active area 57 as shown in FIG. 5. After following steps, a plurality of compliant bumps 60 is disposed on the active area 57 and the compliant bumps 60 are centrally disposed on the center of the chip 50 for electrically connecting to the chip 50 and the substrate 54, and an adhesive 53 daubed on a joint area of the substrate 54 and the chip 50 for jointing the substrate 54 and the chip 50. In other words, the compliant bumps 60 are disposed on the center of the chip 50 and the connecting pads 56 are disposed on the outer periphery of the chip 50. Furthermore, the compliant bumps 60 electrically connect to the connecting pads 56 respectively via a lower metal layer 58 and an upper metal layer 62. Therefore, each compliant bump 60 can be positioned on the geometric center of the chip 50 so as to solve the warp problem of bonding process.

Figure 5A:
FIG. 5H is a top view showing the structure of chip of the present invention.
FIG. 5I is a schematic view showing the structure of chip of the present invention.
Figure 5B:
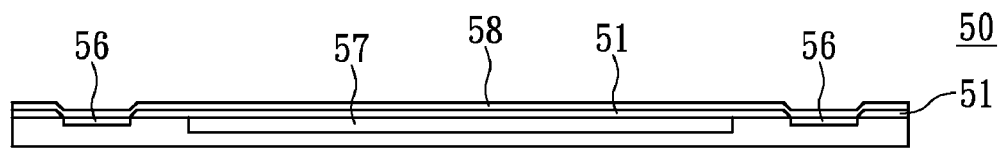
Figure 5C:
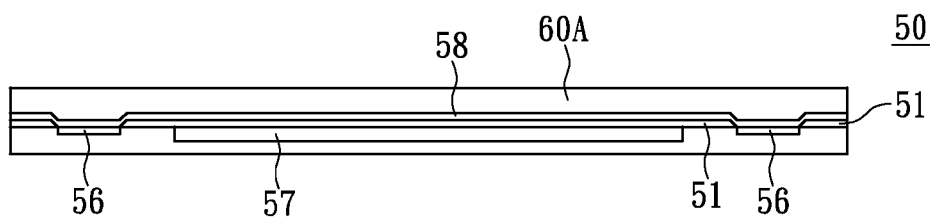

Please refer to FIG. 5A, a passivation layer 51 is disposed on the chip 50. The active area 57 is covered by the passivation layer 51 and the connecting pads 56 are not covered by the passivation layer 51. The compliant bump 60 is connected with the corresponding connecting pad 56 by at least one metal layer. In the embodiment, two metal layers are formed to connect the compliant bump 60 with the connecting pads 56. Therefore, a lower metal layer 58 is formed on the passivation layer 51 and the connecting pads 56 by a sputtering method so that the connecting pads 56 connect with the lower metal layer 58.

Figure 5D:
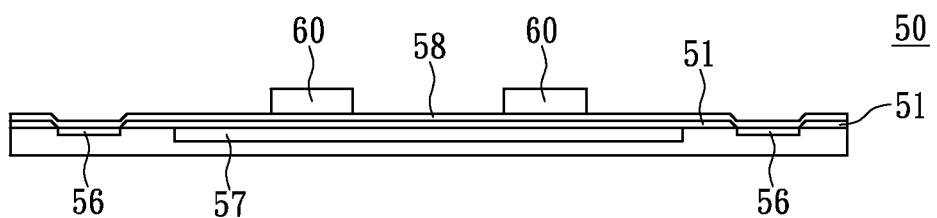
Figure 5E:
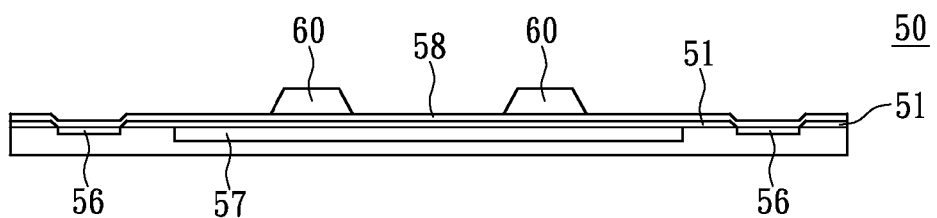

Next step is forming the compliant bumps 60 on the lower metal layer 58. A continuous PI layer 60A is formed on the lower metal layer 58, and the PI layer 60A is made of conductive polymer. Then, a mask is applied for defining the separate compliant bumps 60 on the active area 57 (as shown in FIG. 5D) and a baking step is shaping the compliant bumps 60 (as shown in FIG. 5E). The pitch (distance between the adjacent compliant bumps 60) can be less than 50 micron. Alternatively, it is not necessary for positioning all of the compliant bumps 60 on the active area 57. In other words, some compliant bumps 60 are disposed on the corresponding connecting pads 56 (the same structure with the traditional device) and the remaining compliant bumps 60 are disposed on the active area 57.

Figure 5F:
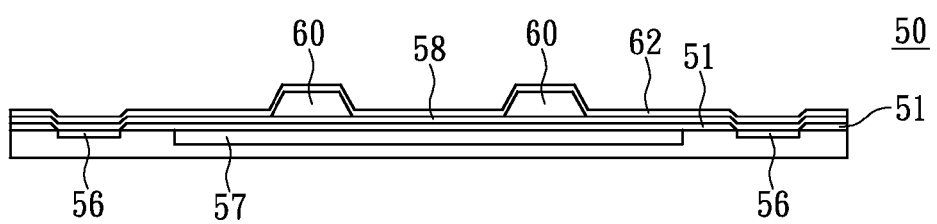
Figure 5G:
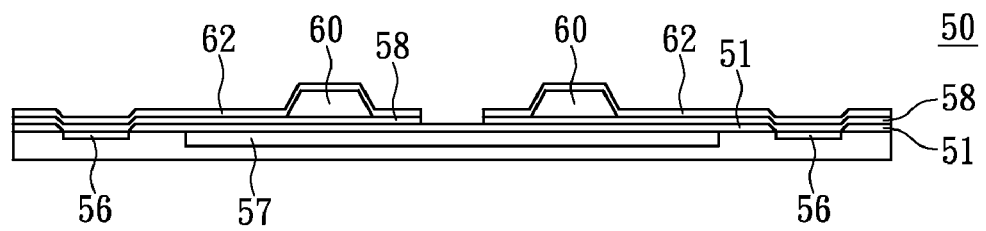
Figure 5H:
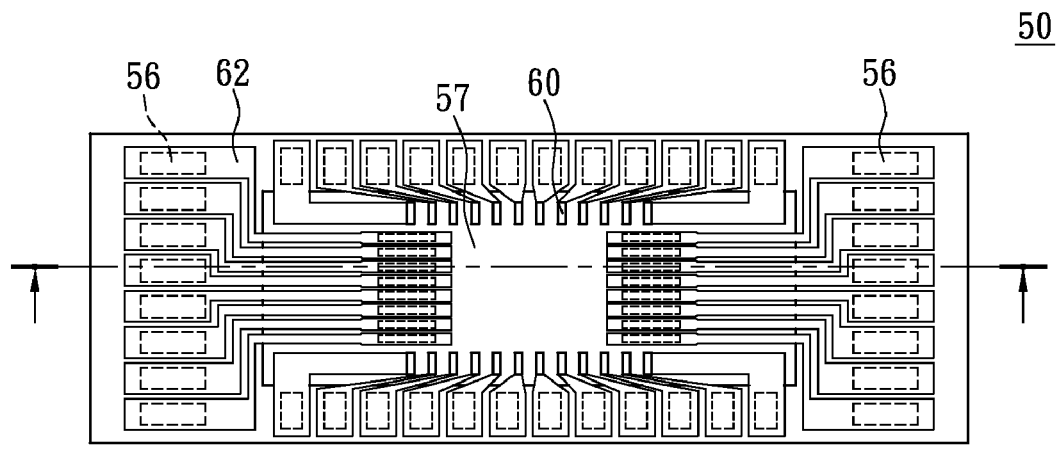
Figure 5I:
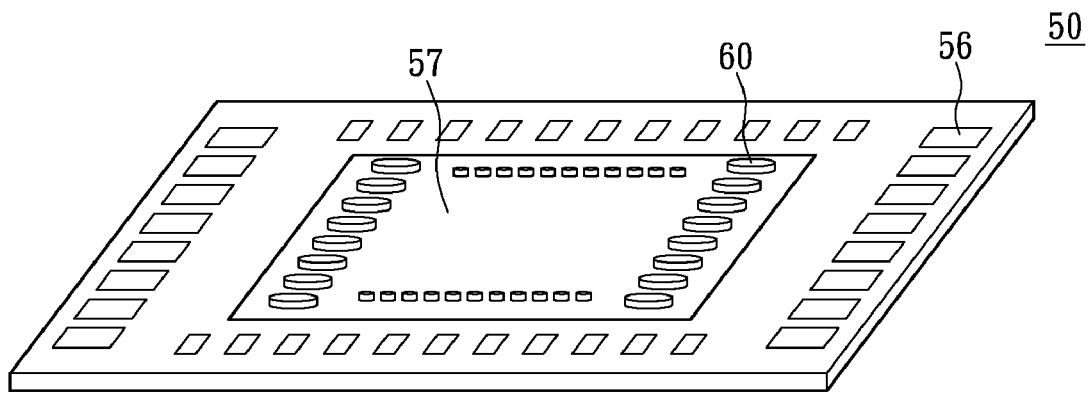
Figure 6:
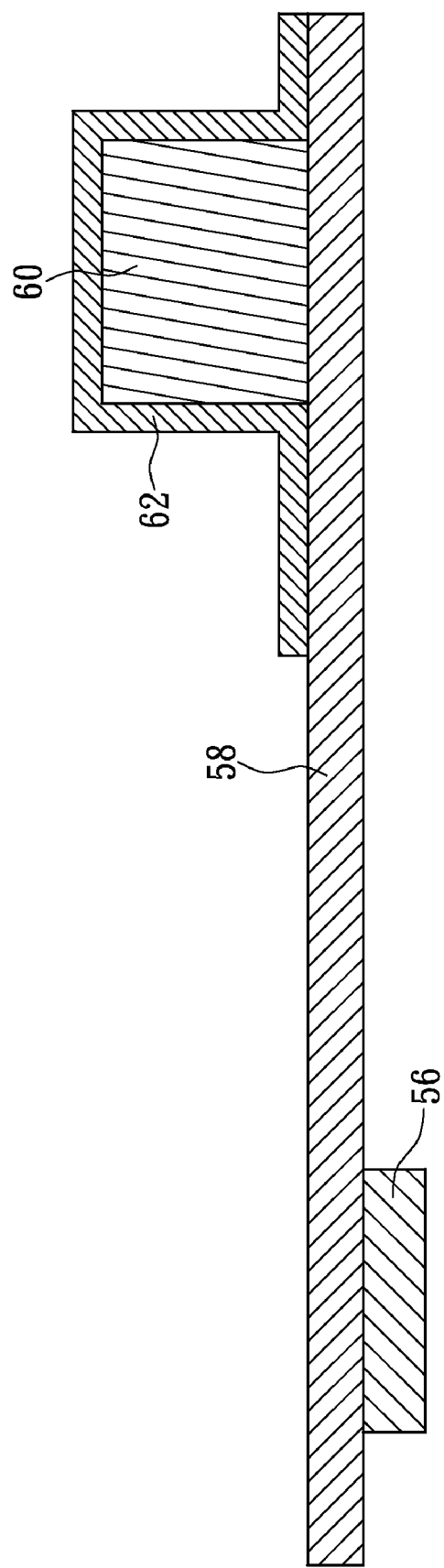
FIG. 6 is schematic views showing the structures of the compliant bumps of the present invention.

Next step is forming an upper metal layer 62 on the compliant bumps 60 and the lower metal layer 58 (as shown in FIG. 5F). Therefore, the compliant bumps 60 can be positioned in the center of the chip 50 (i.e., on the active area 57) rather than on the outer periphery of the chip 50 (i.e., on the connecting pads 56). Next step is etching the lower and upper metal layers 58, 62 to isolate the compliant bumps 60 from each other (as shown in FIG. 5G). Please refer to FIGS. 5H and 5I, the compliant bump 60 on the active area 57 connects electrically with the corresponding connecting pads 56 via the lower and upper metal layers 58,62 (Note that the metal layers are omitted in FIG. 5I for the sake of simplicity). FIG. 6 shows the compliant bump 60 connects electrically with the corresponding connecting pads 56 via the lower and upper metal layers 58,62. Reference is made to FIG. 6, which is schematic view showing the structures of the compliant bump 60 of the present invention. The compliant bump 60 is formed with a lower metal layer 58 and an upper metal layer 62. The upper metal layer 62 covers two opposite side surfaces of the compliant bump 60 to connect with the lower metal layer 58 for electrically connecting the substrate 54 and the connecting pads 56 of the chip 50, and the other two opposite side surfaces that don't cover the metal layer 62 for preventing the lateral electrical connection of the adjacent compliant bumps 60 so that the compliant bumps 60 centrally disposed on the center of the chip 50 will not short. Therein, the lower metal layer 58 is a Ti—W metal layer, the compliant bump 60 is formed with a polymer, and the upper metal layer 62 is an Au metal layer.

By extending the lower metal layer 58 to change the position of the compliant bumps 60, the compliant bumps 60 are centrally disposed on the chip 50 without changing the electrical characteristics and the wiring arrangement of the chip 50. The manufacture of the compliant bump 60 can also use the process of producing the compliant bumps, without changing the numbers of masks or the numbers of processes needed, as long as the lower metal layer 58 is extended to move the compliant bumps 60 to the center of the chip 50.

Figure 4A:
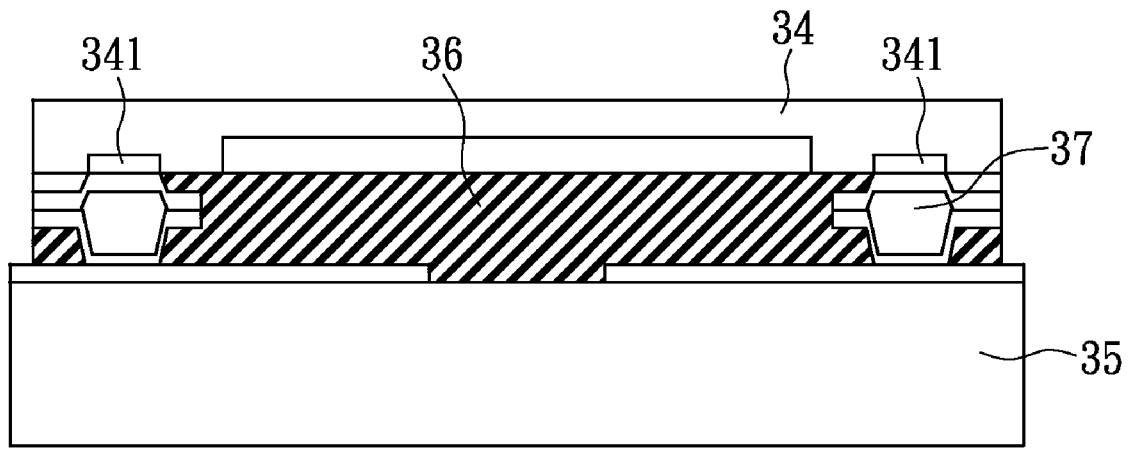
FIG. 4A shows the traditional chip fixed on a substrate.
Figure 7D:
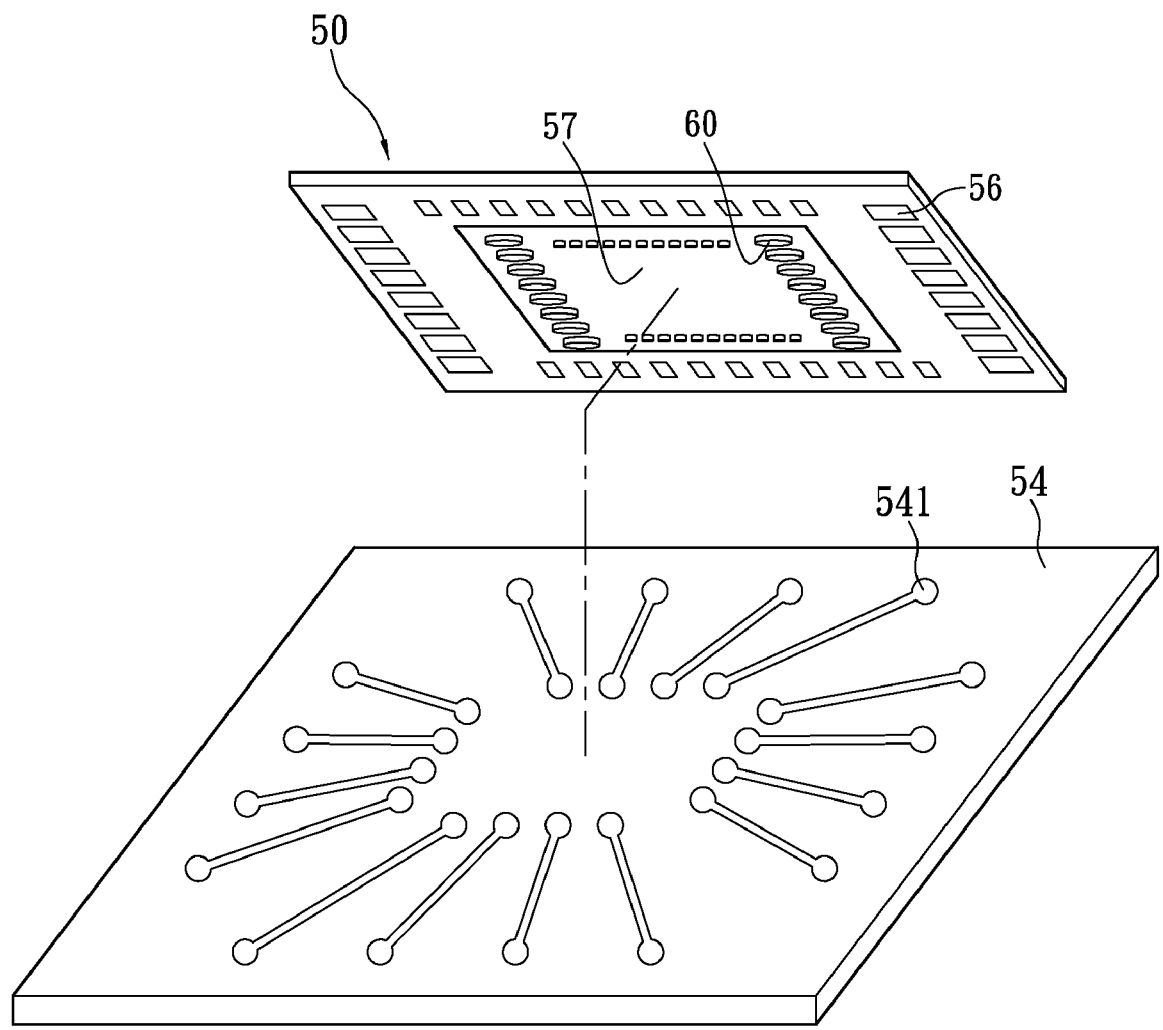
FIG. 7D is an exploded view showing the flip chip device of the present invention.
Figures 1, 7D:
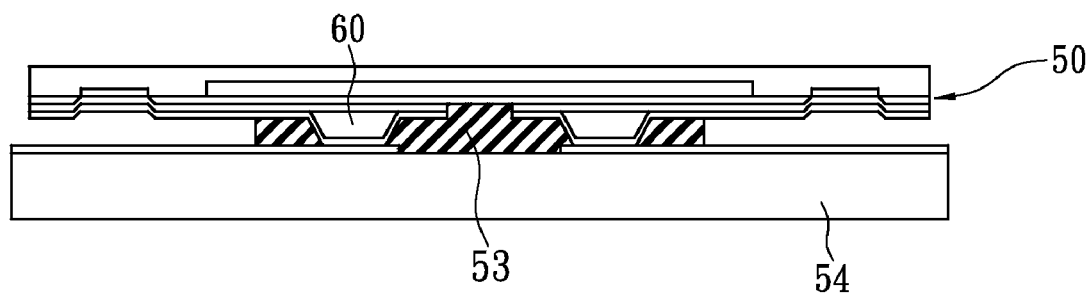
Figures 2, 7D:
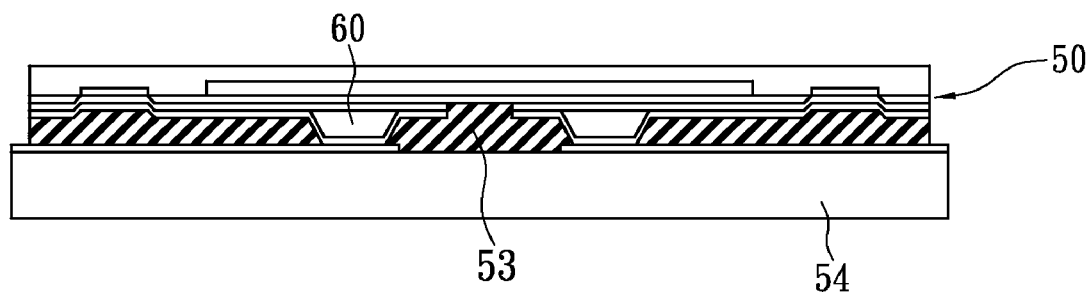
Figures 3, 7D:
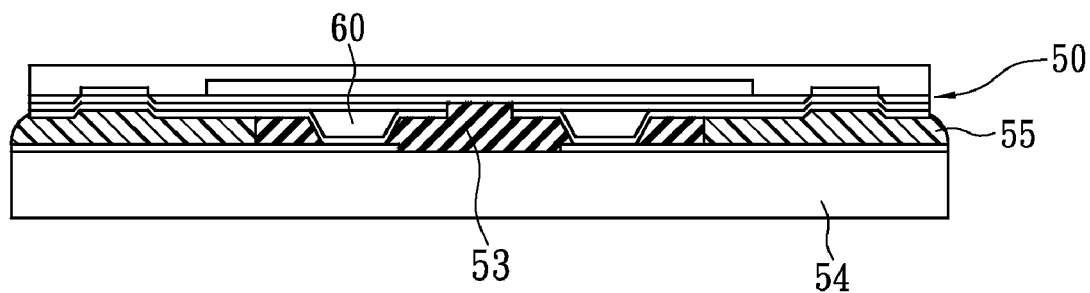

Please refer to FIGS. 7A and 7B, a thermal bonding and pressing method is applied. In the bonding process, an adhesive 53 (for example, ACF, ACA, NCF, NCA) is disposed on the substrate 54 and a tool (i.e., thermal head) provides heat and presses on the chip 50 to adhesive the chip 50 with the substrate 54 via the adhesive 53. The temperature of the bonding step is below 200° C. The chip 50 is fixed on the substrate 54 by the cured adhesive 53 which is only filled between the compliant bumps 60 and at least one conductive trace 541 of the substrate 54 (i.e., the joint area is corresponding to the active area 57) and the outer periphery of the chip 50 is suspending from the substrate 54. In other words, the outer periphery of the chip 50 does not connect with the substrate 54 and the joint area of the chip 50 and the substrate 54 is equal to or smaller than the area of the active area 57. Therefore, the warp value of the substrate 54 will be reduced after the bonding process because of the smaller joint area between the chip 50 and the substrate 54. FIGS. 7C and 7D show the chip 50 fixed on the substrate 54 schematically (Note the adhesive 53 is omitted in FIG. 7D). Comparing with FIG. 7D-1 and FIG. 4A, the present invention can use less adhesive 53 than the traditional structure (as shown in FIG. 4A) because that the compliant bumps 60 are centrally disposed on the substrate 54. Therefore, the cost is reduced.

On the other hand, in the same usage of the adhesive 53, the length for preventing the compliant bumps 60 from the moisture. In the traditional structure, the bumps 37 are located near the edge of the substrate 35 so that the moisture takes much influence on the bumps 37. In contrary, the compliant bumps 60 are centrally disposed on the substrate 54 and the gap between the substrate 54 and chip 50 so that the compliant bumps 60 of the present invention are protected from the moisture due to the longer distance between the compliant bumps 60 and the edge of the substrate 54.

Figure 3:
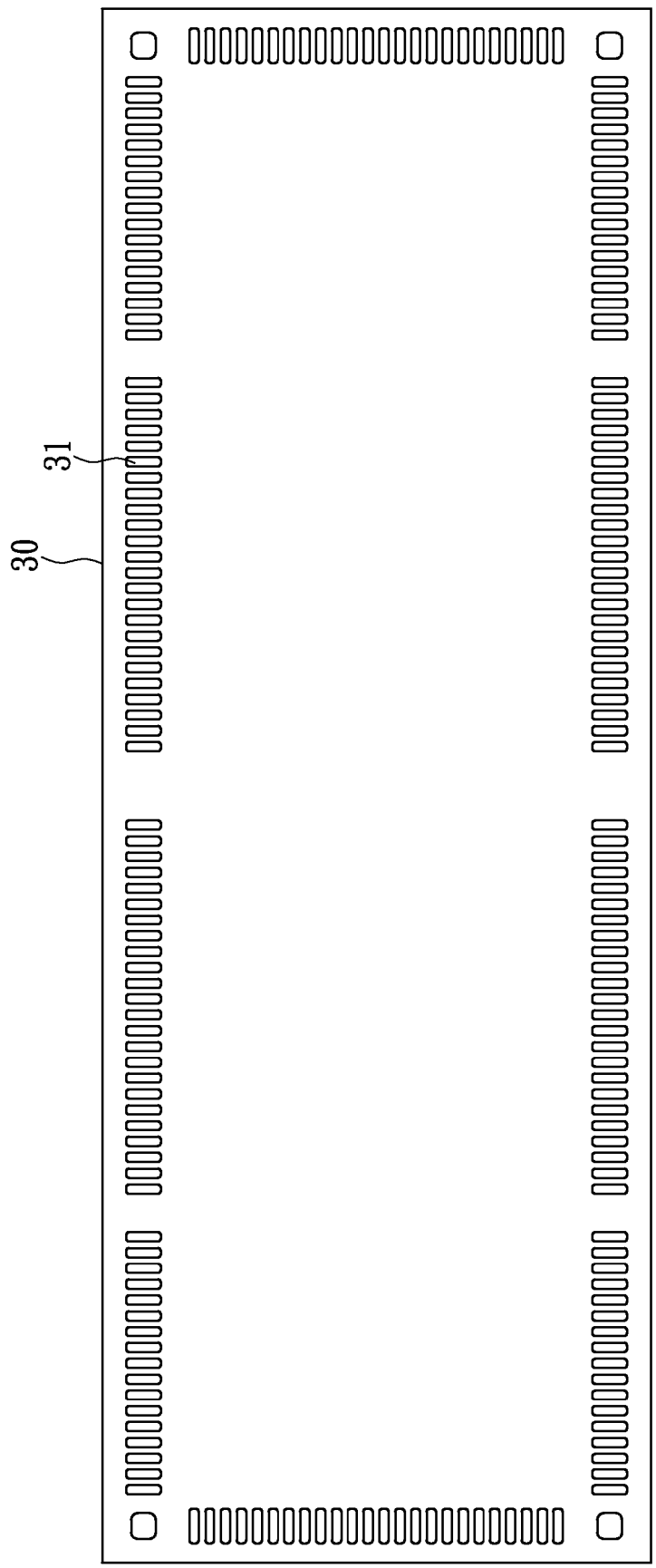
FIG. 3 is a schematic view showing the arrangement of the compliant bumps (on the periphery of the chip) of the prior art.

Furthermore, a second adhesive 55 can be used in the gap between the substrate 54 and chip 50 and be located on the side of the adhesive 53 (as shown in FIG. 7D-3). The second adhesive 55 has higher anti-moisture property than the adhesive 53 so that the compliant bumps 60 of the present invention are more protected from the moisture.

Figure 4B:
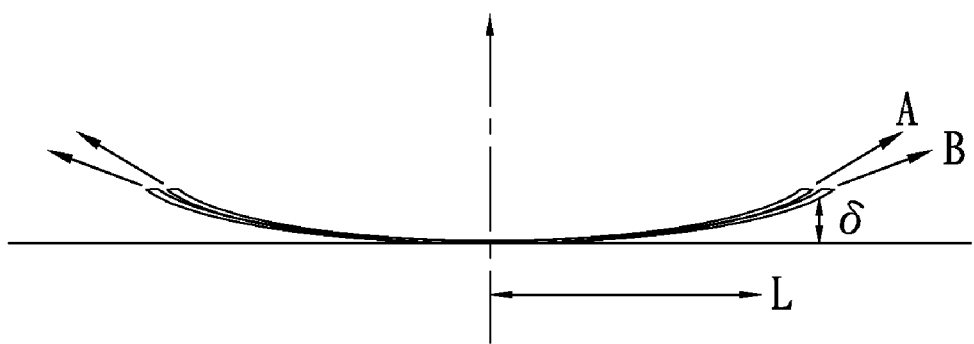
FIG. 4B is a schematic view showing the warped COG of the flip chip device due to the thermal deformation of the prior art.
Figure 7E:
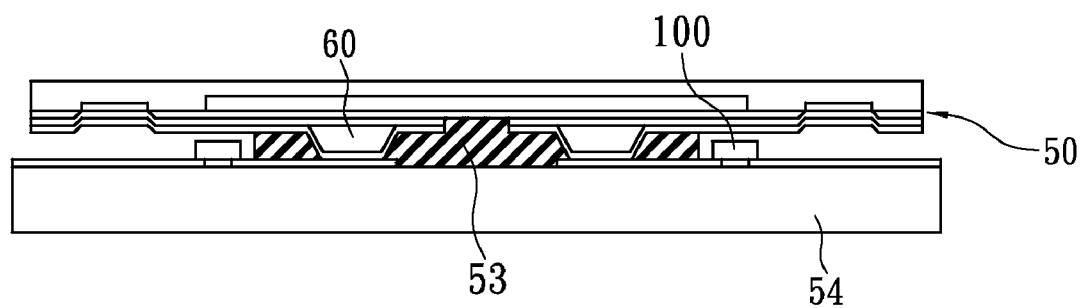
FIG. 7E is a schematic view showing at least one passive component disposed on the substrate of the present invention.
Figures 1, 7E:
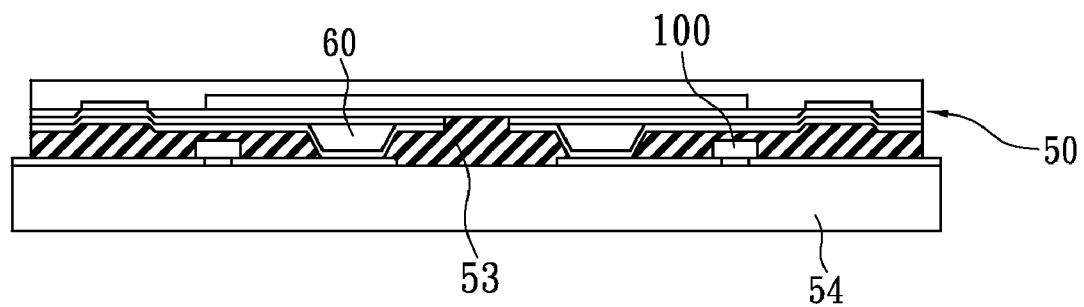
Figures 2, 7E:
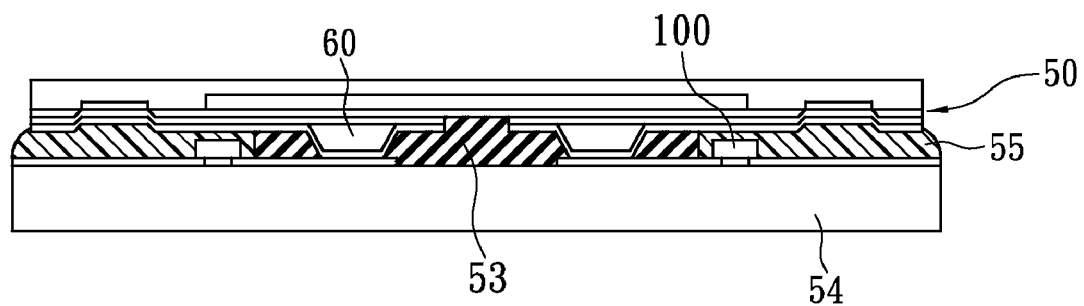
Figure 7F:
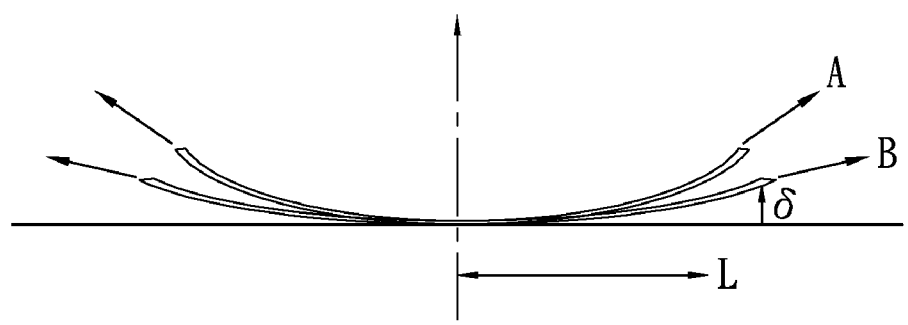
FIG. 7F shows the warp of the flip chip device due to the thermal deformation of the present invention.
Figure 12:
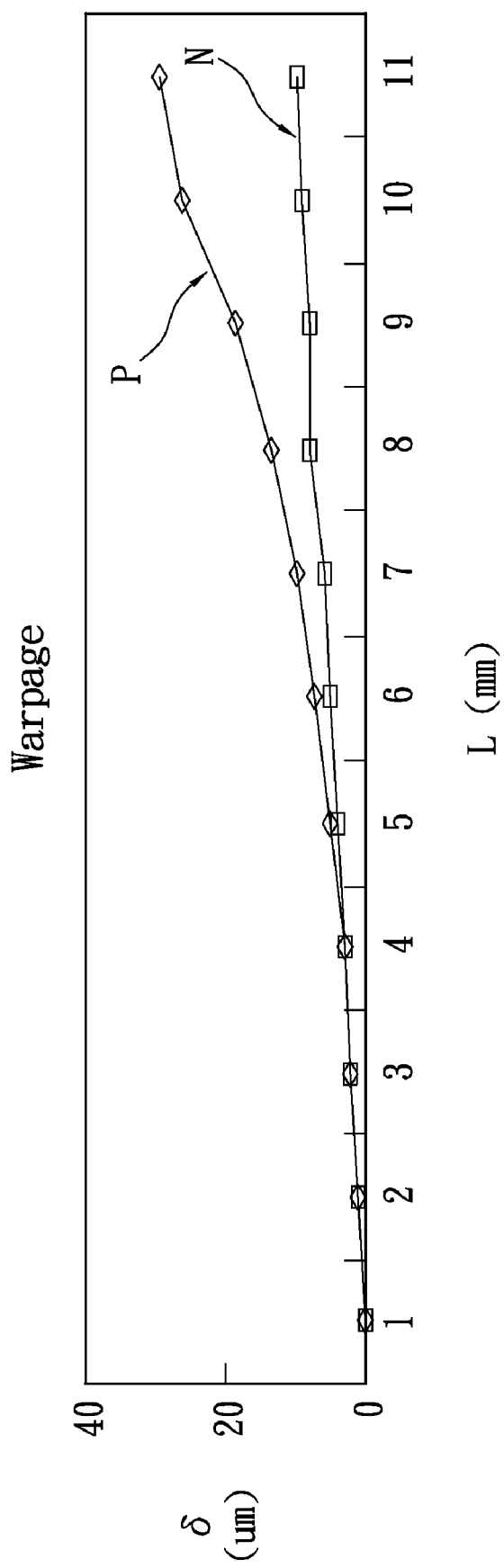
FIG. 12 shows the comparison of substrate warpage of prior art and of the present invention.

FIG. 7E shows the side-view of the chip 50 fixed on the substrate 54. Comparing with the traditional device, the outer periphery of the chip 50 is suspending from the substrate 54 and there is a gap between the chip 50 and the substrate 54. Therefore, after the bonding step, the outer periphery of substrate 54 will have a smaller degree of warp 6 in the same distance L. In other words, the line B of FIG. 7F has smaller degree of warp 6 in the outer periphery than the line B of FIG. 4B has. Thus, the smaller degree of warp 6 provides the better structure of the flip chip device. In accordance with FIG. 12, P line and N line show the substrate warpage of the traditional device and the flip chip device of the present invention respectively. P line indicates the larger warp 6 in the same distance L from the center of the device. Therefore, the warpage of the substrate can be reduced by positioning the compliant bump 60 in the center portion of the chip 50.

Figure 1:
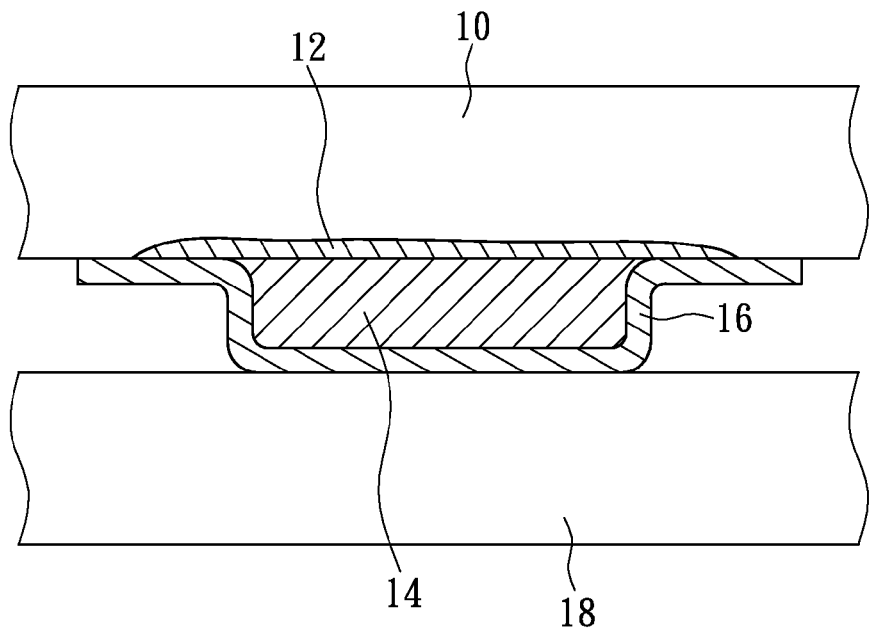
FIG. 1 is a schematic view showing the structure of the conductive compliant bump of the prior art.
Figure 2:
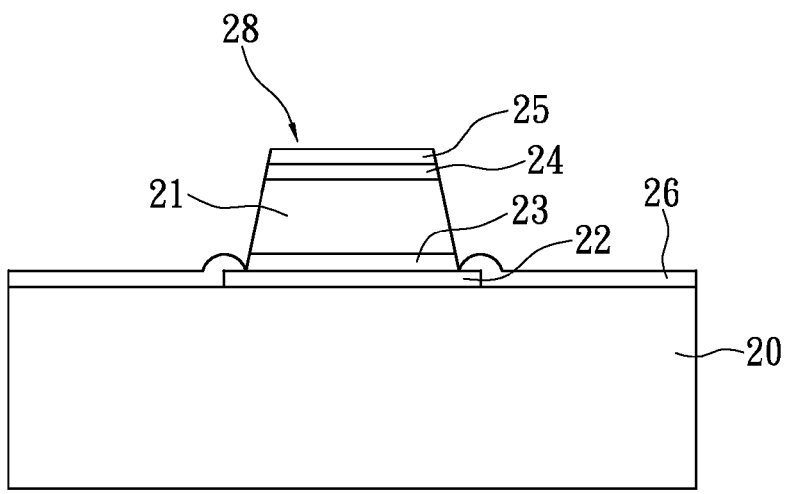
FIG. 2 is another schematic view showing a conductive compliant bump structure of the prior art.

On the other hand, at least one passive component 100 can be disposed near the cured adhesive 53 and between the chip 50 and the substrate 54 (as shown in FIG. 7E). Because the outer periphery of the chip 50 is suspending from the substrate 54, at least one passive component 100 can be electrically disposed on the substrate 54 for reducing the area of substrate 54. Alternatively, the layout of the conductive traces 541 of the substrate 54 without adhesive 53 can have various designs for increasing the integrality. Similarly with FIGS. 7D-2 and 7D-3, the gap of the structure of FIG. 7E can be filled with the adhesive 53 (as shown in FIG. 7E-1) or the second adhesive 55 (as shown in FIG. 7E-2) for covering the passive component 100.

Moreover, the flip chip device further comprises a non-conductive adhesive or the same adhesive daubed into the remaining gap of the substrate 54 and the chip 50 after the bonding step so as to protect the compliant bumps 60 from moisture. Therein, the adhesive 53 is comprised of an anisotropic conductive film, an UV glue, or a non-conductive glue; the substrate is an organic substrate, a ceramic substrate, a glass substrate, a silicon substrate, or a GaAs substrate.

Figure 7G:
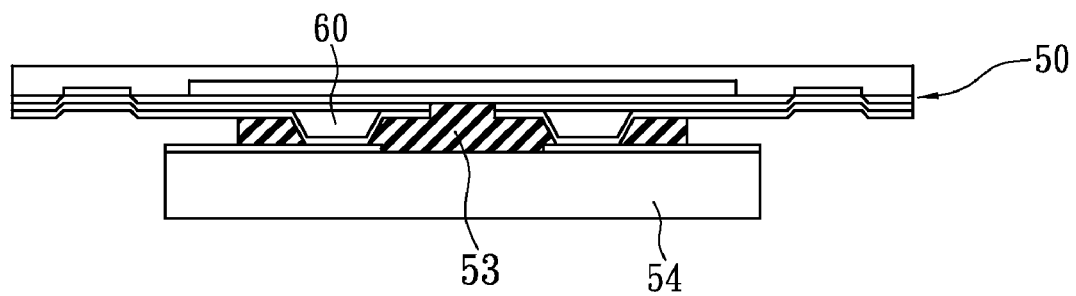
FIG. 7G is a schematic view showing a smaller substrate provided in the flip chip device of the present invention.
Figures 1, 7G:
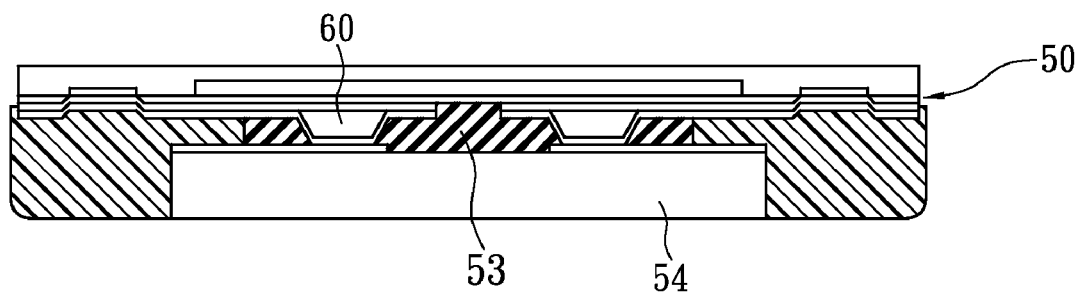

Furthermore, the area of the substrate 54 can be smaller than the area of the chip 50 (i.e., CSP, chip size package), as shown in FIG. 7G. Therefore, the cost of the flip chip device is reduced. Alternatively, the adhesive 53 or the second adhesive 55 can be used for filling the gap and covering the sidewall of the substrate 54 so as to protect the device from the moisture.

On the other hand, the density of the compliant bumps 60 can be calculated by dividing the number of the compliant bumps 60 by the area of the adhesive 53. Assuming the same number of the compliant bumps 60, the present invention provides a smaller area of the adhesive 53 (because the area of the adhesive 53 is smaller than the area of the active area 57) than the traditional flip chip device (because of the area of the adhesive 53 of the traditional structure is almost equal to the area of the chip 50). Thus, the present invention provides higher density of the compliant bumps 52 than the traditional device provides.

Figure 8:
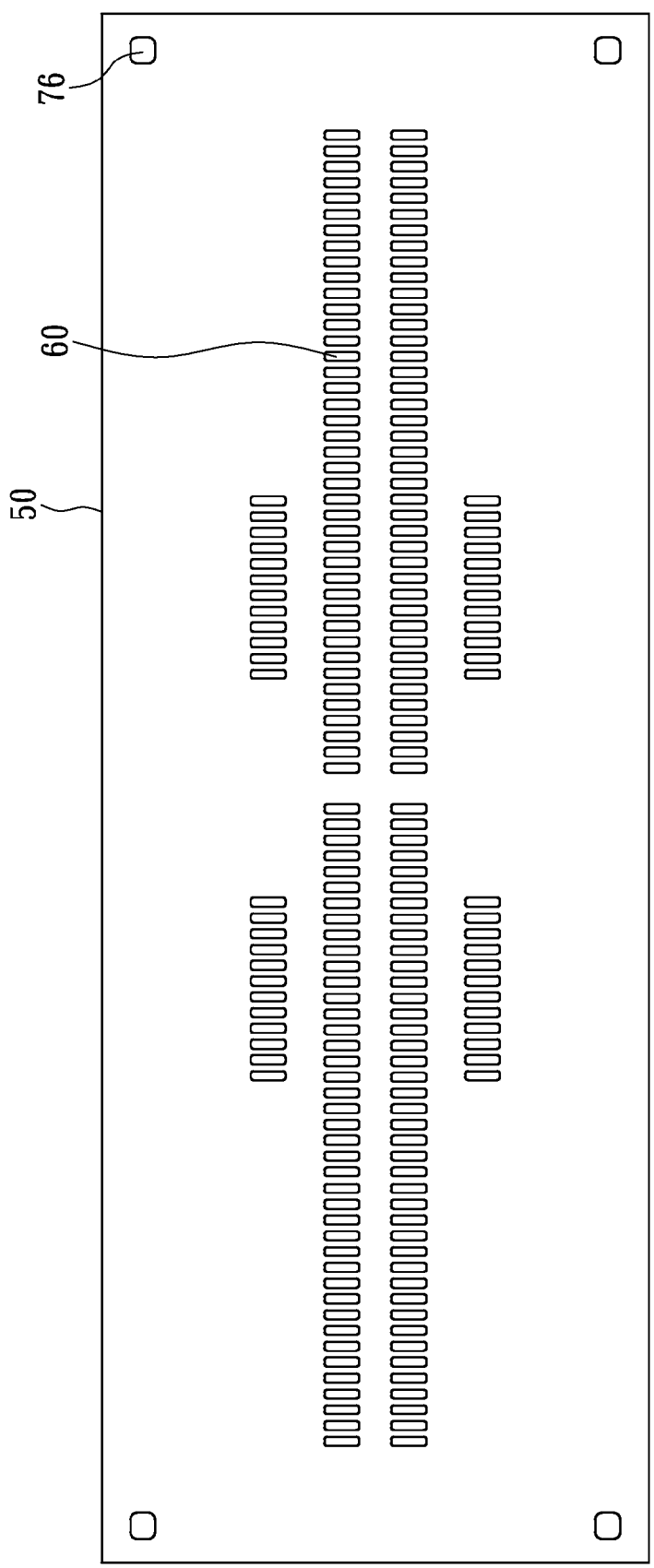
FIG. 8 is a schematic view showing the second embodiment of the present invention.

Reference is made to FIG. 8, which is a schematic view showing the second embodiment of the compliant bumps 60 disposed on the chip 50 of the present invention. Included are a chip 50 which has a surface and a plurality of compliant bumps 60 thereon, the compliant bumps 60 are centrally disposed on the center of the chip 72, and a plurality of non-conductive bumps 76 are disposed in a corner of the chip 50 for maintaining the parallel of the joint.

Figure 9A:
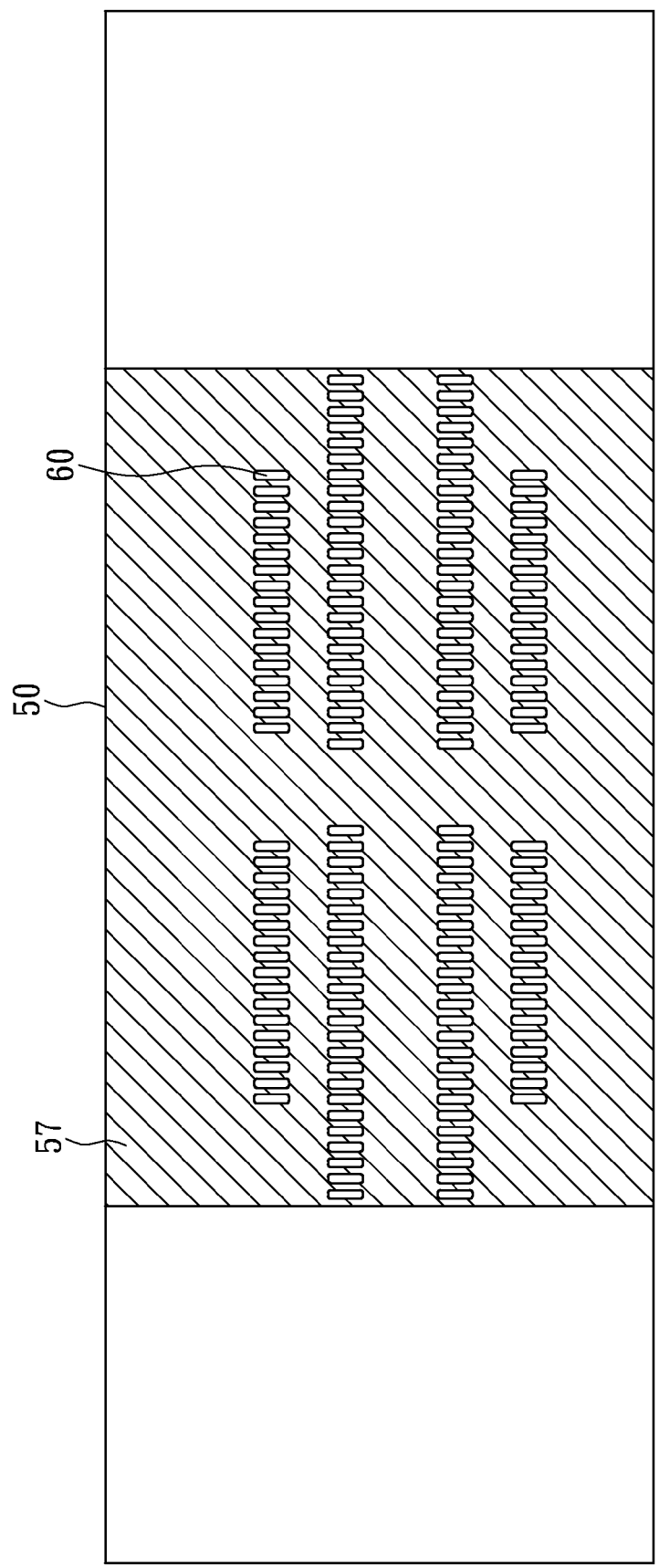
FIG. 9A is a schematic view showing the third embodiment of the present invention.

Reference is made to FIG. 9A, which is a schematic view showing the third embodiment of the compliant bumps 60 disposed on the chip 50 of the present invention. Included is a chip 50 having an active area 57 and a plurality of compliant bumps 60 disposed on active area 57.

Figure 9B:
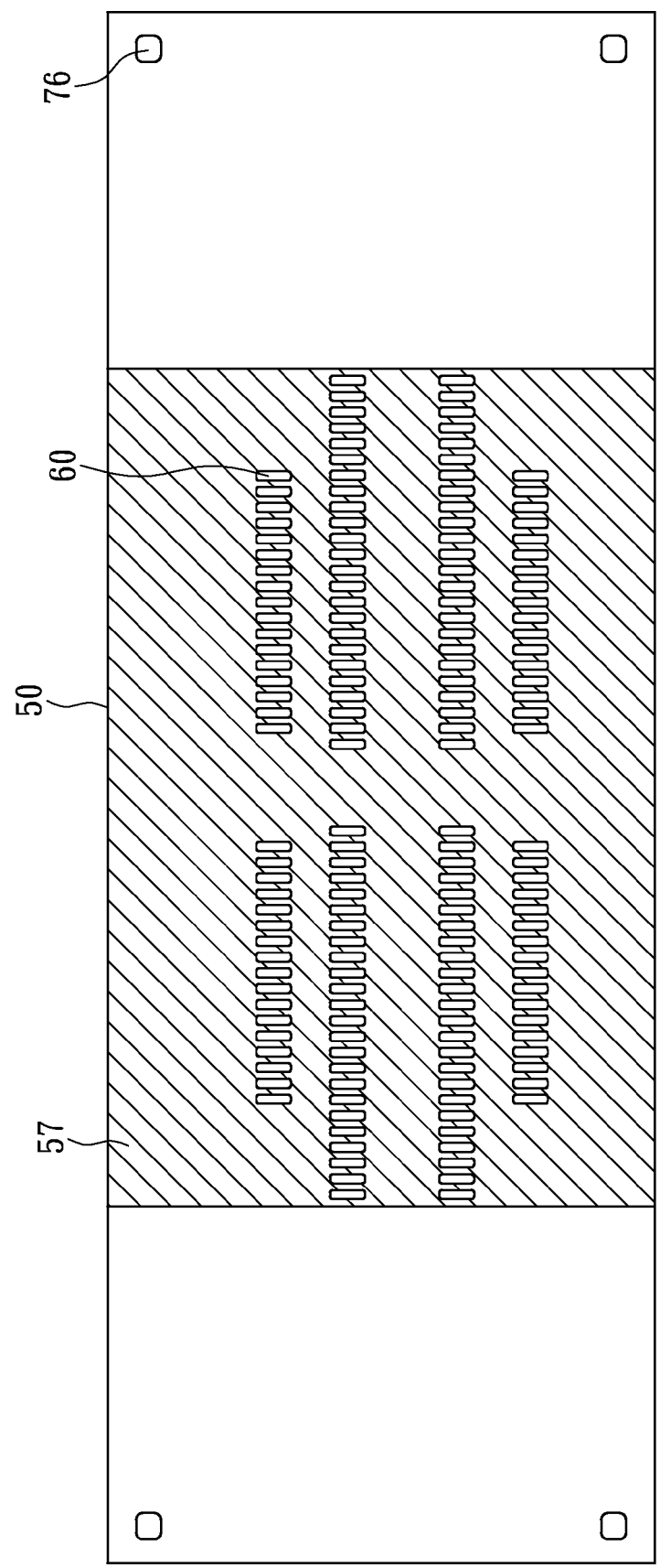
FIG. 9B is a schematic view showing the fourth embodiment of the present invention.

Reference is made to FIG. 9B, which is a schematic view showing the fourth embodiment of the compliant bumps 60 disposed on the chip 50 of the present invention. Included is a chip 60 having an active area 57 and a plurality of compliant bumps 60 disposed on active area 57 and a plurality of non-conductive bumps 76 that are disposed in a corner of the chip 50 for maintaining the parallel of the joint.

Figure 10A:
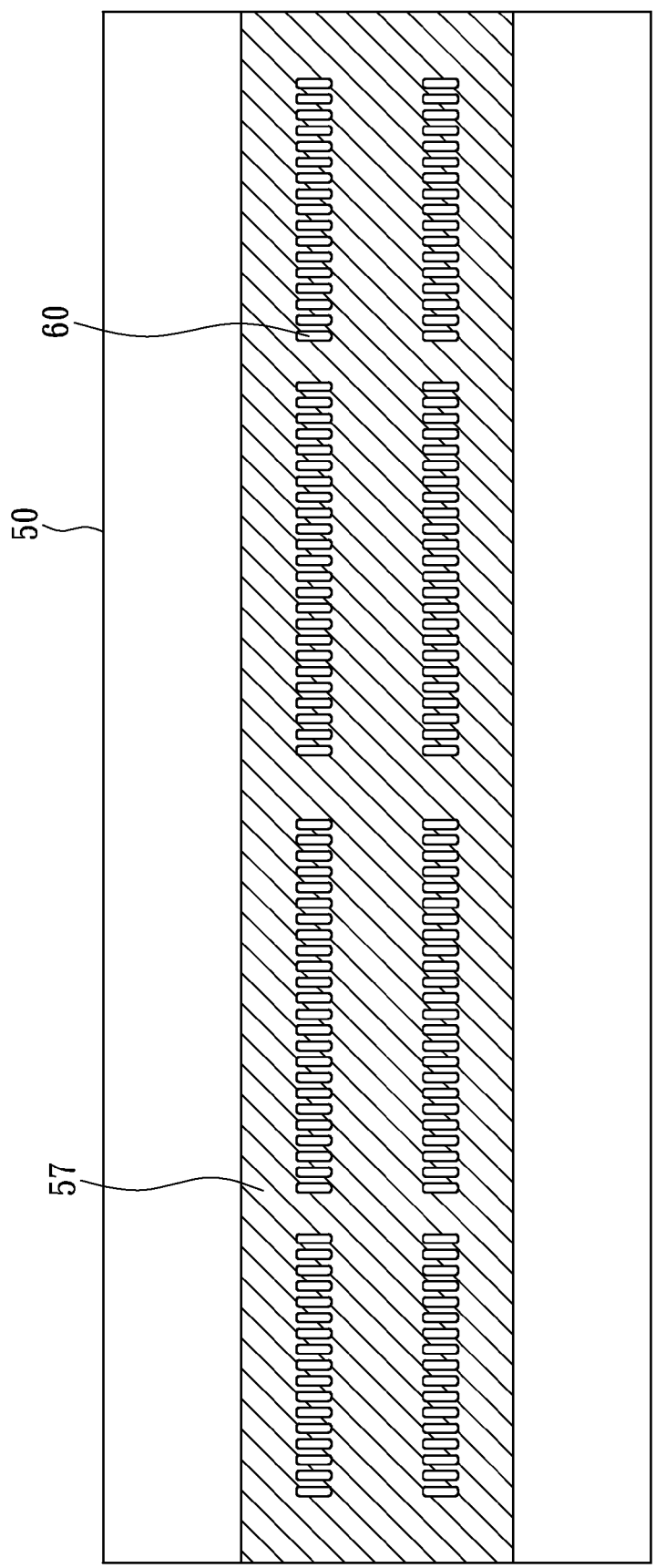
FIG. 10A is a schematic view showing the fifth embodiment of the present invention.

Reference is made to FIG. 10A, which is a schematic view showing the fifth embodiment of the compliant bumps 60 disposed on the chip 50 of the present invention. Included is a chip 50 and a plurality of compliant bumps 60 disposed on an active area 57 of the chip 60.

Figure 10B:
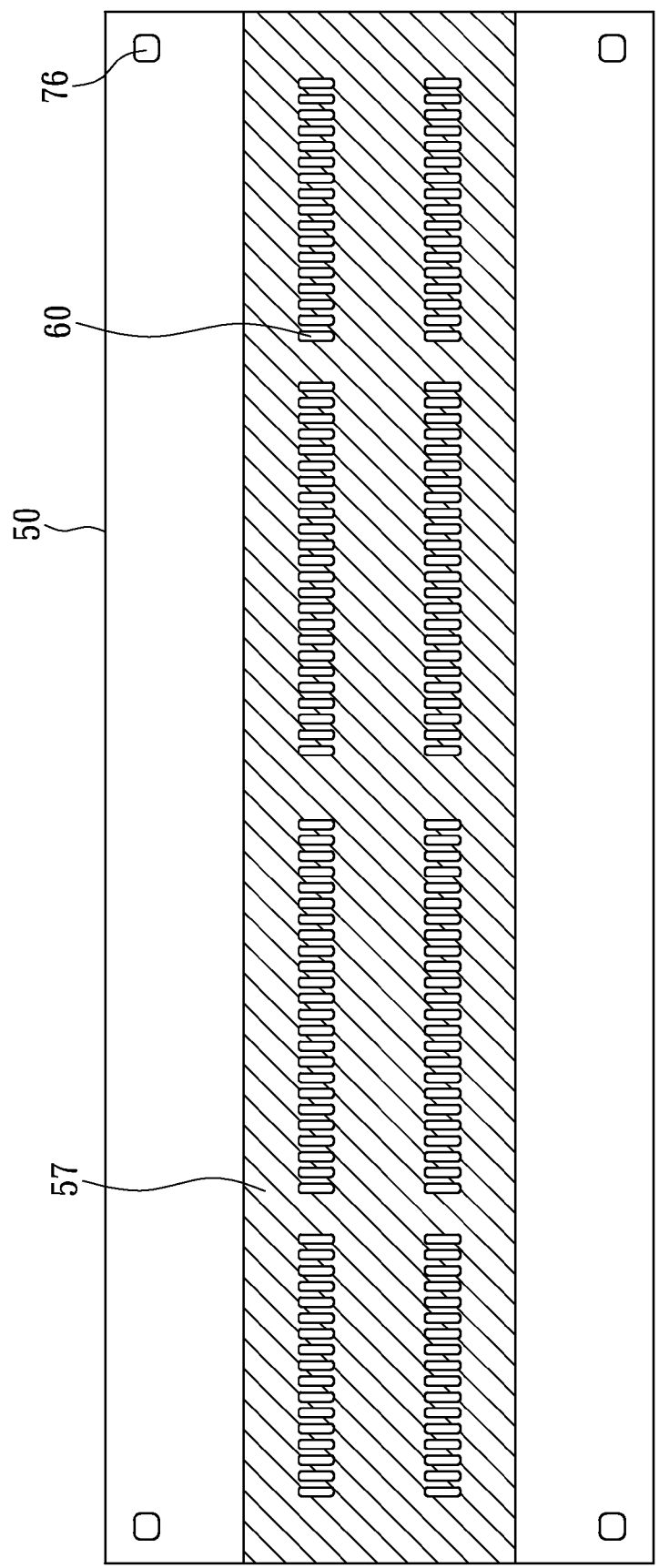
FIG. 10B is a schematic view showing the sixth embodiment of the present invention.

Reference is made to FIG. 10B, which is a schematic view showing the sixth embodiment of the compliant bumps 60 disposed on the chip 50 of the present invention. Included is a chip 50 and a plurality of compliant bumps 60 disposed on an active area 57 of the chip 50, and a plurality of non-conductive bumps 76 disposed in a corner of the chip 50 for maintaining the parallel of the joint.

Figure 11A:
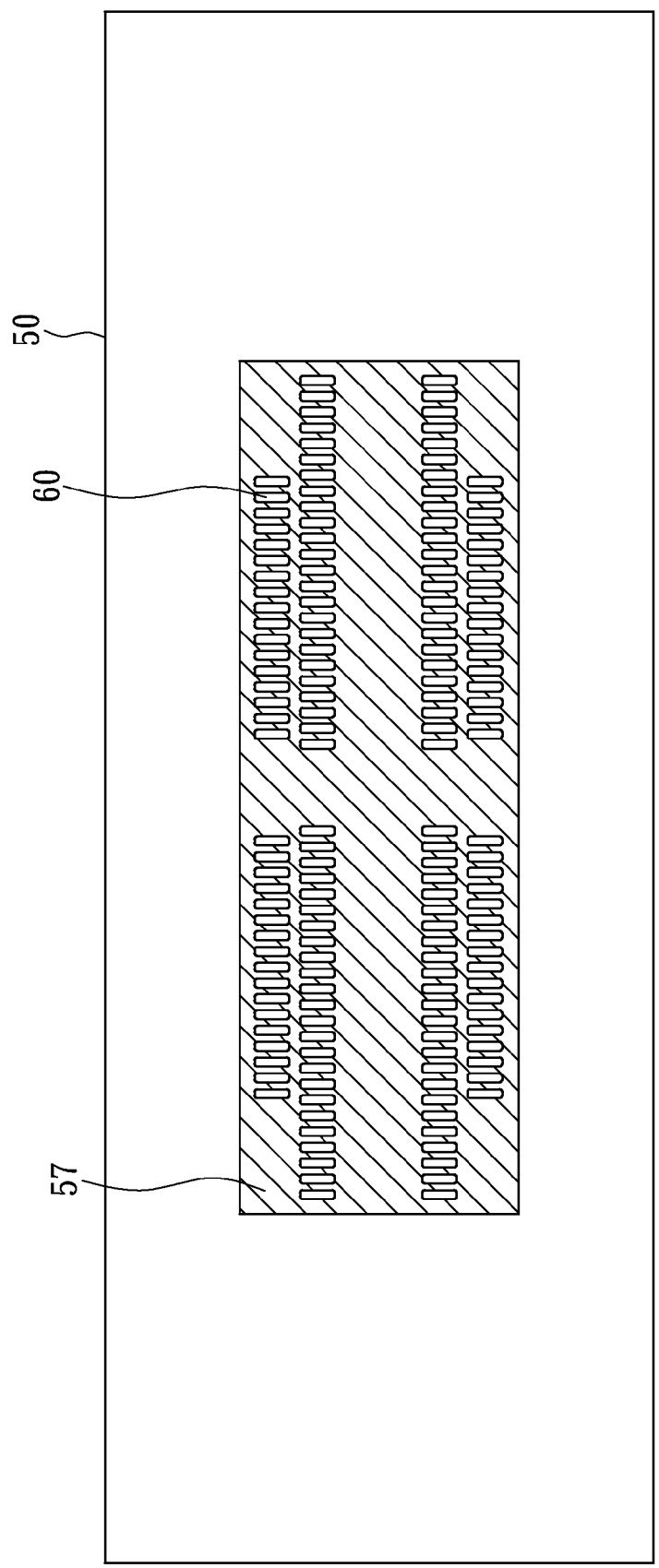
FIG. 11A is a schematic view showing the seventh embodiment of the present invention.

Reference is made to FIG. 11A, which is a schematic view showing the seventh embodiment of the compliant bumps 60 disposed on the chip 50 of the present invention. Included is a chip 50 and a plurality of compliant bumps 60 centrally disposed on an active area 57 of the chip 50.

Figure 11B:
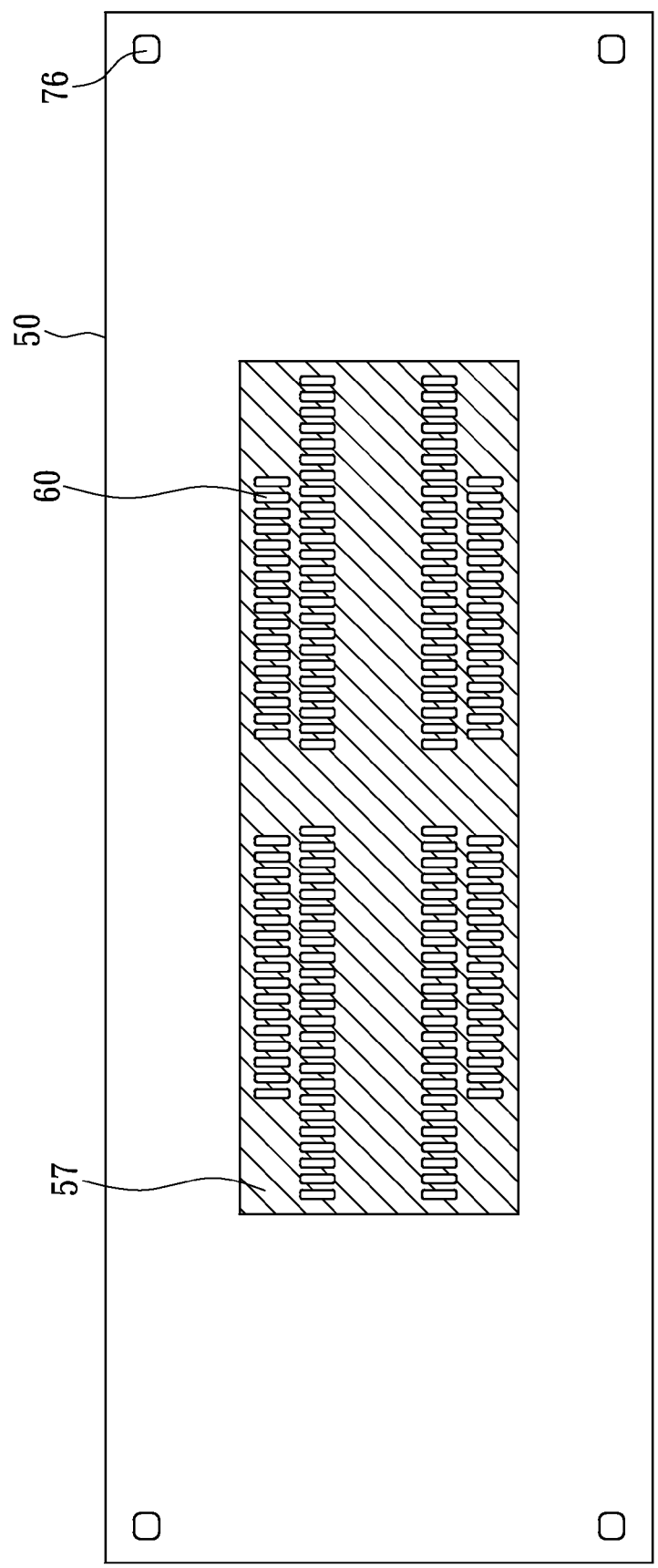
FIG. 11B is a schematic view showing the eighth embodiment of the present invention.

Reference is made to FIG. 11B, which is a schematic view showing the eighth embodiment of the compliant bumps 60 disposed on the chip 50 of the present invention. Included is a chip 50 and a plurality of compliant bumps 60 centrally disposed on an active area 57 whose diagonal lines are half of the length of the chip 50, and a plurality of non-conductive bumps 76 that are disposed in a corner of the chip 50 for maintaining the parallel of the joint.

The present invention provides a method of adhesive flip chip for fixing the chip 50 on the substrate 54. The method of adhesive flip chip is compared with the traditional method of solder flip chip and the differences are shown in Table. 1.

TABLE 1

|  | adhesive flip chip | solder flip chip |
|---|---|---|
| Temperature | below 200° C. | above 250° C. |
| Pressure | Yes | No |
| connection | bump connected to the metal | melt solder ball |
| Pitch | below 50 um | above 150 um |

There are characteristics and efficiencies of the present invention described below:

1. The bumps inwardly disposed on the center of the chip avoid the delamination of the adhesives because of the thermal stress, thereby maintaining the quality of the inner joints.

2. The joints of the bumps inwardly assembled on the center of the chip so that the substrate has less warpage.

3. The position of the bumps inwardly shrinks to extend the distance of air or moisture to the joints so as to prolong their reliability.

4. The non-conductive adhesive is used on a non-conductive joint area (i.e., the remaining gap between the chip and the substrate) to reduce the costs added in the prior art due to the need for a conductive adhesive.

5. To avoid bending of the glass substrate due to adhesive bleeding.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A flip chip device, comprising:
a substrate, having at least one conductive trace thereon;
a chip having an active area on the center of the chip and an outer periphery surrounding the active area, a plurality of connecting pads being formed on the outer periphery of the chip, a plurality of compliant bumps being formed and disposed on the active area, each compliant bump being connected electrically with a corresponding one of the plurality of connecting pads via at least one metal layer, the compliant bumps being centrally disposed on the center of the chip for electrically connecting to the conductive trace on the substrate; and
a first adhesive partially daubed between the substrate and the chip, the first adhesive being disposed under the active area of the chip to be aligned with the active area for jointing the compliant bumps of the chip with the conductive trace of the substrate, the outer periphery of the chip being suspended from the substrate without the first adhesive filling a space between the chip and the substrate.

2. The flip chip device as in claim 1, further comprising a lower metal layer and an upper metal layer, respectively disposed on a lower surface and an upper surface of the compliant bumps, wherein
the upper metal layer covers two opposite side surfaces of the compliant bumps to connect with the lower metal layer for electrically connecting the substrate and the chip, and
another two opposite side surfaces of the compliant bumps are free of the upper metal layer covered thereon.

3. The flip chip device as in claim 2, wherein the lower metal layer is a Ti—W metal layer.

4. The flip chip device as in claim 2, wherein the bumps are formed with polymer.

5. The flip chip device as in claim 2, wherein the upper metal layer is an Au metal layer.

6. The flip chip device as in claim 1, further comprising:
a plurality of non-conductive compliant bumps disposed in a corner of the chip for maintaining the parallel of the joint between the substrate and the chip.

7. The flip chip device as in claim 1, wherein the substrate is an organic substrate, a ceramic substrate, a glass substrate, a silicon substrate or a GaAs substrate.

8. The flip chip device as in claim 1, wherein the first adhesive is an anisotropic film, a UV glue, or a non-conductive glue.

9. The flip chip device as in claim 1, further comprising:
a second adhesive daubed in the remaining gap between the substrate and the chip.

10. The flip chip device as in claim 1, further comprising:
at least one passive component electrically disposed on the substrate in the remaining gap between the substrate and the chip.

11. A manufacturing method of a flip chip device, comprising the steps of:
providing a substrate, the substrate having at least one conductive trace thereon;
providing a first adhesive in select first areas on the substrate, with select second areas on the substrate being free of the adhesive;
pressing a chip on the first adhesive and curing the first adhesive for bonding the chip and the substrate, the chip having an active area on the center of the chip and an outer periphery surrounding the active area;
forming a plurality of connecting pads on the outer periphery of the chip;
forming a plurality of compliant bumps on the active area, the compliant bumps being centrally disposed on the center of the chip for electrically connecting to the conductive trace on the substrate;
disposing the cured first adhesive under the active area of the chip to be aligned with the active area for jointing the compliant bumps of chip with the conductive trace of the substrate, so that the outer periphery of the chip is suspended from the substrate without the first adhesive filling a space between the chip and the substrate; and
connecting each compliant bump connecting electrically with a corresponding one of the plurality of connecting pads via at least one metal layer.

12. The manufacturing method as in claim 11, wherein in the step of pressing a chip on the first adhesive and curing the first adhesive, the first adhesive is cured below 200° C.

13. The manufacturing method as in claim 11, further comprising the step of:
electrically disposing at least one passive component on the substrate in the remaining gap between the substrate and the chip.

14. The manufacturing method as in claim 11, further comprising the step of:
providing a second adhesive for filling into the remaining gap between the substrate and the chip.

15. The manufacturing method as in claim 14, wherein the second adhesive has higher anti-moisture property than the first adhesive.

16. The manufacturing method as in claim 11, wherein in the step of disposing the cured first adhesive, the area of the disposed first adhesive for jointing the compliant bumps of chip with the conductive trace of the substrate is smaller than or equal to the area of the active area.

17. The flip chip device as in claim 9, wherein the second adhesive has higher anti-moisture property than the first adhesive.

18. The flip chip device as in claim 1, wherein the area of the disposed first adhesive for jointing the compliant bumps of chip with the conductive trace of the substrate is smaller than or equal to the area of the active area.

* * * * *